(12) United States Patent
Watanabe et al.

(10) Patent No.: US 8,319,948 B2
(45) Date of Patent: Nov. 27, 2012

(54) EVALUATION METHOD AND EXPOSURE APPARATUS

(75) Inventors: Shu Watanabe, Saitama (JP); Masato Hagiri, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 499 days.

(21) Appl. No.: 12/561,536

(22) Filed: Sep. 17, 2009

(65) Prior Publication Data

US 2010/0073654 A1     Mar. 25, 2010

(30) Foreign Application Priority Data

Sep. 25, 2008   (JP) ................. 2008-246329

(51) Int. Cl.
*G03B 27/62* (2006.01)
*G03B 27/32* (2006.01)
(52) U.S. Cl. ......................................... 355/75
(58) Field of Classification Search .............. None
See application file for complete search history.

(56) References Cited

U.S. PATENT DOCUMENTS

| | | | |
|---|---|---|---|
| 6,335,784 B2 * | 1/2002 | Mishima ................. | 355/53 |
| 6,982,786 B2 | 1/2006 | Shiode | |
| 6,989,885 B2 | 1/2006 | Osakabe et al. | |
| 2003/0053035 A1 * | 3/2003 | Butler et al. ............... | 355/53 |
| 2006/0250598 A1 * | 11/2006 | Sasaki .......................... | 355/55 |

FOREIGN PATENT DOCUMENTS

| | | |
|---|---|---|
| JP | 10-092718 A | 4/1998 |
| JP | 10-214780 A | 8/1998 |
| JP | 2000-164504 A | 6/2000 |
| JP | 2004-193160 A | 7/2004 |
| WO | 03/088329 A1 | 10/2003 |

* cited by examiner

*Primary Examiner* — Toan Ton
*Assistant Examiner* — Michelle Iacoletti
(74) *Attorney, Agent, or Firm* — Rossi, Kimms & McDowell LLP

(57) ABSTRACT

An exposure apparatus includes an original stage mounted with an exposure original having a pattern used for exposure, and an evaluation original having a pattern used to evaluate an optical performance of a projection optical system, a first drive mechanism configured to drive the original stage in a first direction that is a scan direction, and a second drive mechanism configured to drive the evaluation original on the original stage in a second direction orthogonal to the first direction, a width of the evaluation original in the second direction is smaller than that of the exposure original in the second direction.

8 Claims, 3 Drawing Sheets

EVALUATION METHOD AND EXPOSURE APPARATUS

BACKGROUND OF THE INVENTION

1. Field of the Invention

The present invention relates to an evaluation method and an exposure apparatus.

2. Description of the Related Art

In the conventional projection exposure apparatus, the optical performance of a projection optical system, such as a focus, a distortion, and other aberrations, is evaluated based on an exposure result that is obtained by utilizing an actually exposed original. However, as the original becomes larger and the exposure performance deteriorates due to a self-weight deformation of the original, it is difficult to determine whether any error in the exposure result attributes to the projection optical system or the original. Accordingly, Japanese Patent Laid-Open No. ("JP") 10-92718 proposes to form a press chamber on one surface side of the original, and to correct the deformation of the original by adjusting the pressure in the press chamber. JP 10-214780 proposes a correction through a focus control of the projection optical system.

Other prior art include International Publication No. WO03/088329.

As the original becomes larger, it becomes difficult to remove the self-weight deformation of the original only through the correction mechanism proposed in JP 10-92718. In addition, as the original becomes larger, influence of an uneven thickness or a patterning error amount of the original upon the resolving performance becomes non-negligible. Moreover, as in JP 10-214780, when an error of the original is converted into an error of the projection optical system, a highly precise correction cannot be performed.

SUMMARY OF THE INVENTION

The present invention provides an evaluation method and an exposure apparatus, which can reduce an error caused by a large original, and precisely evaluate an optical performance of a projection optical system.

An exposure apparatus according to one aspect of the present invention includes a projection optical system configured to project an image of a pattern of an original onto a substrate, an original stage mounted with an exposure original having a pattern used for exposure, and an evaluation original having a pattern used to evaluate an optical performance of the projection optical system, a first drive mechanism configured to drive the original stage in a first direction that is a scan direction, and a second drive mechanism configured to drive the evaluation original on the original stage in a second direction orthogonal to the first direction, a width of the evaluation original in the second direction is smaller than that of the exposure original in the second direction.

An evaluation method according to another aspect of the present invention configured to evaluate an optical performance of a projection optical system in an exposure apparatus configured to project an image of an exposure pattern of an exposure original onto a substrate using the projection optical system, to move the exposure original and the substrate in a scan direction, and to expose the substrate includes moving, in a direction orthogonal to the scan direction, an evaluation original having an evaluation pattern used to evaluate the optical performance of the projection optical system, projecting an image of the evaluation pattern via the projection optical system, wherein a width of the evaluation original in the direction orthogonal to the scan direction is smaller than that of the exposure original in the direction orthogonal to the scan direction.

Further features of the present invention will become apparent from the following description of exemplary embodiments with reference to the attached drawings.

DESCRIPTION OF THE EMBODIMENTS

Figure 1:
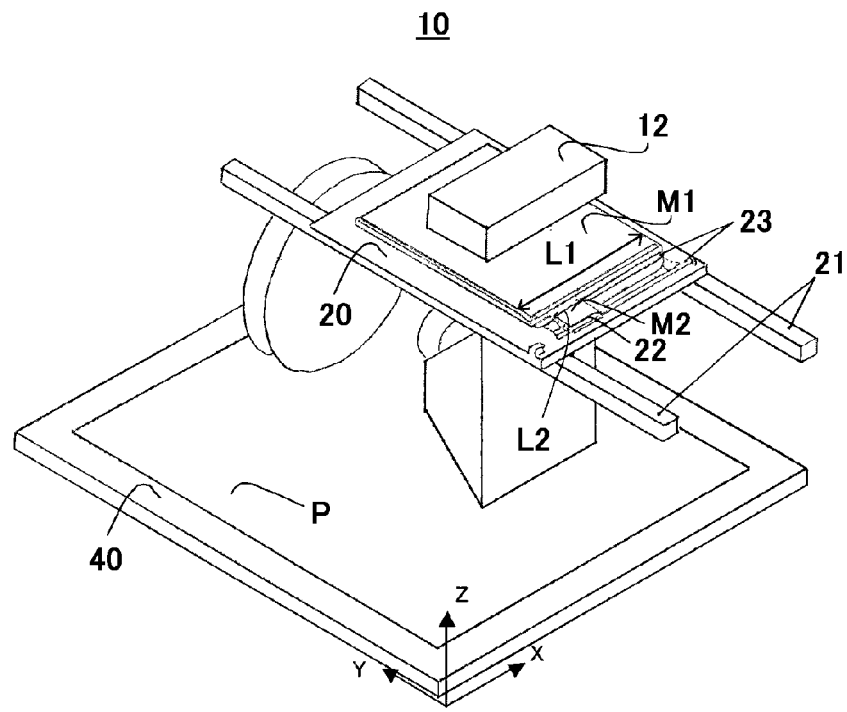
FIG. 1 is a perspective view of an exposure apparatus.
Figure 2:
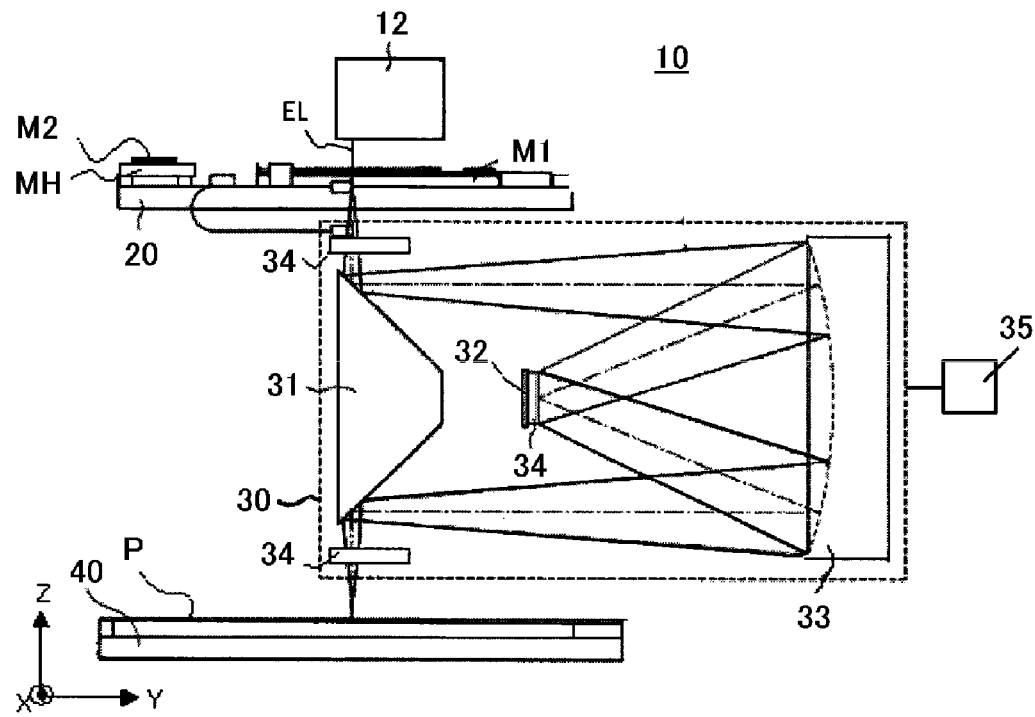
FIG. 2 is a sectional view of the exposure apparatus shown in FIG. 1.

FIG. 1 is a perspective view of an exposure apparatus 10 of this embodiment, and FIG. 2 is a sectional view of it. The exposure apparatus 10 of this embodiment is a step-and-scan exposure apparatus, and includes an illumination unit 12, an original stage 20, a projection optical system 30, and a substrate stage 40. The exposure apparatus 10 is a projection exposure apparatus configured to illuminate an original M1 using a light beam from a light source and the illumination unit 12, and to scan and expose a pattern of the substrate P via the projection optical system 30.

The illumination unit 12 illuminates the original M1 or M2, and includes a light source configured to emit a light beam as exposure light EL, and an illumination optical system configured to uniformly illuminate the original. The light source can use an ultra high-pressure mercury lamp or an excimer laser. The illumination optical system of this embodiment forms an arc-shaped exposure slit as an illumination area, but a shape of the illumination area is not limited and may use another shape, such as a rectangular shape. The original M1 or M2 is scanned through the exposure slit in the Y-axis direction as a scan direction. The illumination optical system includes a masking blade and a slit member configured to determine an illumination area.

The original stage 20 supports both the original M1 and the original M2. The original stage 20 is provided with a (first) drive mechanism 21 configured to drive the original stage 20 in the Y-axis (or first) direction that serves as the scan direction. The original stage 20 are further provided with a holder 22 configured to hold the original M2, and a (second) drive mechanism 23 configured to drive the holder 22 and the original M2 in the X-axis (or second) direction that is a direction orthogonal to the scan direction. The drive mechanism 23 does not move the original M1 in the X-axis direction and moves only the original M2 on the original stage 20 in the X-axis direction while the original M1 is maintained stationary. As a result, the original M2 is moved to an arbitrary position in an XY plane by the drive mechanisms 21 and 23.

In this embodiment, the original stage 20 mounted with the exposure original M1 is further mounted with the evaluation original M2. However, the original M1 is detached from the original stage 20 at the evaluation time, and the original M2, the holder 22, and the drive mechanism 23 may be attached to a vacant space, the original M2, the holder 22, and the drive mechanism 23 may detached after the evaluation ends and before the exposure starts, and the original M1 may be attached. Alternatively, both originals may be provided to different original stages so as to separate the original stage used for the exposure from the original stage used for the evaluation of the optical performance.

The original M1 is an rectangular exposure original (mask or reticle) having a circuit pattern (or an exposure pattern) used for the actual exposure. The original M1 is large and, if the original M1 is used to evaluate the optical performance of the projection optical system 30, the self-weight deformation, the thickness change, and the patterning error of the original M1 affect the exposure result. As a result, it becomes difficult to determine whether any error in the exposure result attributes to the optical performance of the projection optical system 30 or the original M1.

In this embodiment, the original M1 used for the actual exposure is so large that the influence of its self-weight deformation is non-negligible. More specifically, one side of the rectangular original M1 has a length (or a size) of 250 mm or larger. The original M1 of this embodiment is a transmission type original. Since the transmission type original is held by its four surrounding sides or two sides, the self-weight deformation is likely to occur due to the gravity.

The original M2 is a rectangular evaluation original (mask or reticle) having an evaluation pattern (such as a cross pattern or a vertical pattern) used to evaluate the optical performance of the projection optical system 30. For example, a pattern used to evaluate the distortion is a reference grating pattern. The original M2 of this embodiment is a transmission type original.

The influence of the self-weight deformation of the original upon the exposure reduces as its size becomes smaller and the influence of its self-weight deformation becomes negligible in the sufficiently small original. The original M2 is smaller than the original M1, and the influence of the self-weight deformation of the original M2 is restrained in comparison with the original M1. A length (width) of the side of the original M2 in the X-direction is at least shorter than a length of the side of the original M1 in the X-axis direction or may be shorter than a length of the illumination area of the original M1 in the X-axis direction. In other words, a width of the evaluation original M2 in the X-axis direction (second direction) that is a direction orthogonal to the Y-axis direction (first direction) is smaller than that of the exposure original M1 in the second direction. A width of the original M2 of the Y-axis direction is smaller than a width of the original M1 in the Y-axis direction. In this embodiment, a longer side of the rectangular original M2 is set to such a small size that the influence of the self-weight deformation is negligible, or more specifically 250 mm or smaller. In addition, a shorter side of the rectangular original M2 is set to a size enough large to draw an evaluation pattern, or more specifically 50 mm or larger. As a result, one side of the original M2 is set to 50 mm or larger and 250 mm or smaller. At this time, a shorter side of the exposure area on the original M2 is set to 5 mm or larger and its longer side is set to 205 mm or smaller.

Figure 3:
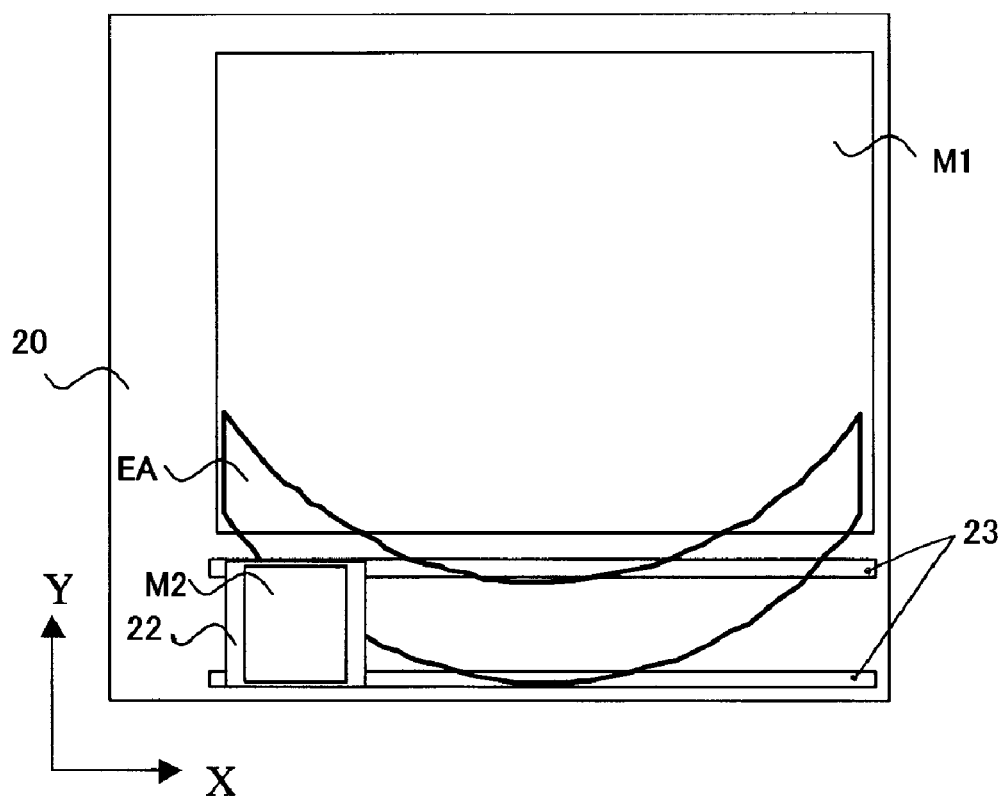
FIG. 3 is a plane view of an original in the exposure apparatus shown in FIG. 1.

FIG. 3 is a plane view showing one example in which the illumination optical system of the illumination apparatus 12 forms an arc-shaped exposure slit EA having a length of 750 nm in the X-axis direction a length of 100 nm in the Y-axis direction. In this case, the 6 inches square original M2 that is patterned in a 110 mm square may be used.

Positional errors in the Y-axis direction and Z-axis direction which occurs when the holder 22 moves in the X-axis direction are used for the performance evaluation when the original stage 20 and the holder 22 are assembled, and reflected on the exposure result. For example, an error in the Z-axis direction which occurs when the holder 22 moves in the X-axis direction is converted into a focus value, and corrected by a movement amount of the substrate stage 40 in the Z-axis direction. In addition, an error in the Y-axis direction which occurs when the holder 22 moves in the X-axis direction is converted into a value of the distortion, and corrected by a drive amount of an optical element drive mechanism 35 used to correct the distortion which is provided in the projection optical system 30.

The projection optical system 30 maintains the original and the substrate P optically conjugate with each other, and projects an image of the original pattern onto the substrate P. In this embodiment, as shown in FIG. 2, the projection optical system is a catadioptric optical system, and includes a trapezoid mirror 31, a convex mirror 32, a concave mirror 33, and an aspheric lens 34. Nevertheless, the present invention does not limit a structure of the projection optical system 30, and may use a dioptric or catoptric optical system instead. While the projection magnification of the projection optical system 30 is 100% (same magnification), the present invention is applicable to a projection optical system having a reduction ratio.

The substrate stage 40 supports the substrate P, and moves the substrates P in each direction of the XYZ axes or each direction around each axis. The substrate P is a liquid crystal substrate in this embodiment, but the present invention does not limit a type of the substrate. The degree of flatness of the substrate P is previously measured; an error caused by the substrate P is converted into a focus value and corrected by a movement amount of the substrate stage 40 in the Z-axis direction.

Figure 4:
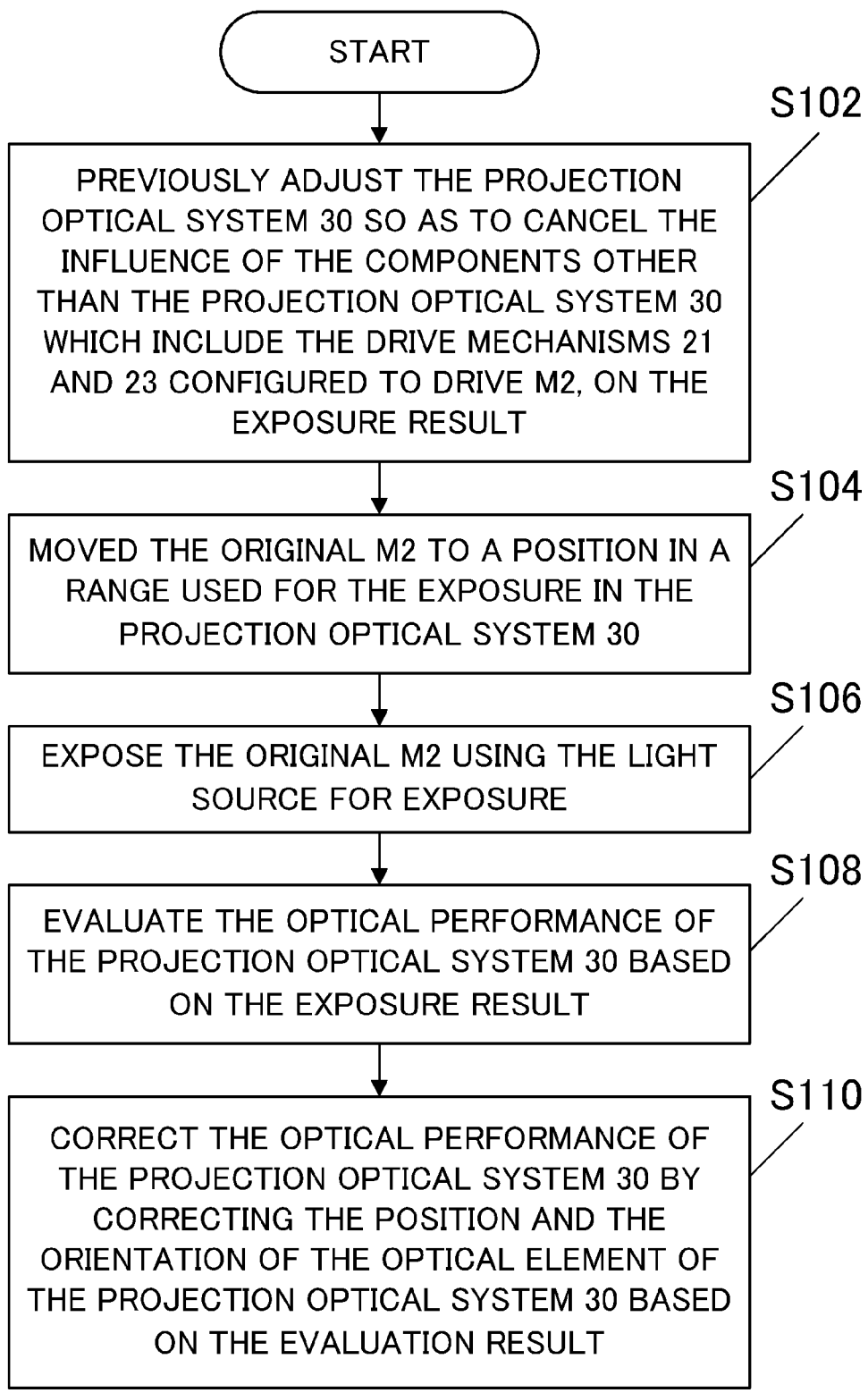
FIG. 4 is a flowchart of an evaluation method of this embodiment.

FIG. 4 is a flowchart for explaining an evaluation method and a correction method. "S" is an abbreviation of the step. S102 to S108 relate to the evaluation method, and S102 to S110 relate to the correction method.

In advance to the evaluation, the original M1 and other necessary components are detached from the original stage 20, and the original M2, the holder 22, and the drive mechanism 23 are attached to the original stage 20. In addition, the projection optical system 30 is previously adjusted so as to cancel the influence of the components other than the projection optical system 30 which include the drive mechanisms 21 and 23 configured to drive M2, on the exposure result (S102).

Next, the original M2 is moved to a position corresponding to a position to be measured in a range used for the exposure in the projection optical system 30 (S104). The original stage 20 is moved in the Y-axis direction by the drive mechanism 21, and the holder 22 is moved in the X-axis direction by the drive mechanism 23.

Next, the original M2 is exposed by using the exposure light source in the illumination apparatus 12 (S106). The exposure light EL that has transmitted through the original M2 enters a part of the region in the projection optical system 30, which projects an image of a pattern of the original M2 onto the substrate P. In this case, the masking blade and the slit member in the illumination apparatus 12 are used to make the illumination area used to illuminate the original M2 smaller than the illumination area used to illuminate the original M1 (or the exposure slit EA shown in FIG. 3) in accordance with the original M2. This configuration can prevent unnecessary light from entering the substrate P.

Next, the optical performance of the projection optical system 30 is evaluated based on the exposure result (S108). As described above, the error caused by the original M2 is restrained, and the errors caused by the drive mechanisms 21 and 23 and the error caused by the substrate P are corrected. As a result, the optical performance of the projection optical system 30 can be precisely measured and evaluated. Instead of evaluating the optical performance of the entire range used for the exposure of the projection optical system 30, the optical performance of a specific range may be evaluated.

After the evaluation is made and before the exposure starts, the optical performance of the projection optical system 30 is corrected by correcting a position and orientation of an optical element in the projection optical system 30 (S110). In addition, the original M2, the holder 22, and the drive mechanism 23 are detached from the original stage 20, and the original M1 and the other necessary components are attached to the original stage 20.

In exposure, the exposure light EL that has transmitted through the original M1 enters the projection optical system 30, and the projection optical system 30 projects an image of the pattern of the original M1 onto the substrate P. Since the optical performance of the projection optical system 30 is corrected based on the evaluation result, the projection optical system 30 can maintain high imaging performance.

A manufacturing method of a device (such as a semiconductor integrated circuit device or a liquid crystal display device) includes the steps of exposing a substrate (such as a wafer or a glass plate) using the above exposure apparatus, developing the substrate, and the other known steps.

The exposure apparatus of this embodiment is also applicable to a step-and-repeat exposure apparatus but in that case a mechanism configured to move the original M2 in the Y-axis direction is necessary.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-246329, filed Sep. 25, 2008, which is hereby incorporated by reference herein in its entirety.

What is claimed is:

1. An exposure apparatus comprising:
    a projection optical system configured to project an image of a pattern of an original onto a substrate;
    an original stage mounted with an exposure original having a pattern for exposure, and an evaluation original having a pattern for evaluating an optical performance of the projection optical system;
    a first drive mechanism configured to drive the original stage in a first direction that is a scan direction; and
    a second drive mechanism provided on the original stage and configured to drive the evaluation original on the original stage in a second direction orthogonal to the first direction, relative to the original stage, so that the pattern of the evaluation original is arrangeable in a plurality of positions within a range used for the exposure in the projection optical system in the second direction,
    wherein a width of the evaluation original in the second direction is smaller than that of the exposure original in the second direction.

2. The exposure apparatus according to claim 1, further comprising:
    an illumination optical system configured to illuminate an illumination area of the exposure original,
    wherein the width of the evaluation original in the second direction is smaller than that of the illumination area of the exposure original in the second direction.

3. The exposure apparatus according to claim 1, wherein a width of the evaluation original in the first direction is smaller than that of the exposure original in the first direction.

4. The exposure apparatus according to claim 1, wherein the exposure original has a side larger than 250 mm, and the evaluation original has a side that is set between 50 mm and 250 mm.

5. An evaluation method of evaluating an optical performance of a projection optical system in an exposure apparatus having an original stage mounted with an exposure original having a pattern for exposure, and an evaluation original having a pattern for evaluating an optical performance of the projection optical system, and configured to project an image of an exposure pattern of the exposure original onto a substrate using the projection optical system, to move the exposure original and the substrate in a scan direction using a first drive mechanism, and to expose the substrate, said evaluation method comprising the steps of:
    moving, in a direction orthogonal to the scan direction, the evaluation original relative to the original stage using a second drive mechanism provided on the original stage, so that the pattern of the evaluation original is arrangeable in a plurality of positions within a range used for the exposure in the projection optical system in the second direction;
    projecting an image of the evaluation pattern via the projection optical system,
    wherein a width of the evaluation original in the direction orthogonal to the scan direction is smaller than that of the exposure original in the direction orthogonal to the scan direction.

6. The evaluation method according to claim 5, wherein an illumination area used to illuminate the evaluation original is smaller than that used to illuminate the exposure original.

7. The evaluation method according to claim 5, further comprising the step of adjusting the projection optical system to cancel influence upon an exposure result of a component other than the projection optical system, which includes a drive mechanism configured to drive the evaluation original.

8. A device manufacturing method comprising the steps of:
    exposing a substrate using an exposure apparatus; and
    developing the substrate that has been exposed,
    wherein the exposure apparatus includes:
    a projection optical system configured to project an image of a pattern of an original onto a substrate;
    an original stage mounted with an exposure original having a pattern for exposure, and an evaluation original having a pattern for evaluating an optical performance of the projection optical system;
    a first drive mechanism configured to drive the original stage in a first direction that is a scan direction; and
    a second drive mechanism provided on the original stage and configured to drive the evaluation original on the original stage in a second direction orthogonal to the first direction, relative to the original stage, so that the pattern of the evaluation original is arrangeable in a plurality of positions within a range used for the exposure in the projection optical system in the second direction,
    wherein a width of the evaluation original in the second direction is smaller than that of the exposure original in the second direction.

* * * * *